United States Patent [19]

Fukuyama

[11] Patent Number: 5,416,645
[45] Date of Patent: May 16, 1995

[54] REPRODUCING CIRCUIT HAVING COMMON BASE AMPLIFIER, LOW-PASS FILTER AND PEAK DETECTOR FOR USE WITH MAGNETORESISTIVE HEAD

[75] Inventor: Munekatsu Fukuyama, Tokyo, Japan

[73] Assignee: Sony Corporation, Tokyo, Japan

[21] Appl. No.: 140,457

[22] Filed: Oct. 25, 1993

[30] Foreign Application Priority Data

Oct. 27, 1992 [JP] Japan .................. 4-289080

[51] Int. Cl.$^6$ .................. G11B 5/09; G01R 33/02
[52] U.S. Cl. .................. 360/46; 324/252
[58] Field of Search .................. 360/46, 65, 67, 68, 360/113, 77.08; 324/252, 207.21; 307/296.1

[56] References Cited

U.S. PATENT DOCUMENTS

| | | | |
|---|---|---|---|
| 4,492,997 | 1/1985 | Arai et al. | 360/113 |
| 4,691,259 | 9/1987 | Imakoshi et al. | 360/113 |
| 4,703,378 | 10/1987 | Imakoshi et al. | 360/113 |
| 4,712,144 | 12/1987 | Klaasen | 360/67 |
| 4,716,306 | 12/1987 | Sato et al. | 307/296.1 |
| 4,734,644 | 3/1988 | Imakoshi et al. | 360/113 X |
| 4,954,906 | 9/1990 | Nakamura et al. | 360/77.08 |
| 5,155,643 | 10/1992 | Jones, Jr. et al. | 360/113 |
| 5,204,789 | 4/1993 | Jove et al. | 360/67 |

FOREIGN PATENT DOCUMENTS

| | | |
|---|---|---|
| 0053343 | 6/1982 | European Pat. Off. . |
| 595266 | 4/1994 | European Pat. Off. . |
| 60-047208 | 3/1985 | Japan . |
| 60-127504 | 7/1985 | Japan . |
| 61-017072 | 1/1986 | Japan . |

OTHER PUBLICATIONS

IBM Technical Disclosure Bulletin, Mar. 1991, "Prefiltering in the Design of Peristaltic Envelope Detectors", vol. 33, No. 10B.
Patent Abstracts of Japan, Jul. 1985, "Detecting Circuit For Resistance Change", vol. 9, No. 163.
IBM Technical Disclosure Bulletin, Aug. 1988, "Voltage Biasing of Single-Ended Mr Elements", vol. 31, No. 3, pp. 369-371.
Patent Abstracts of Japan, Jun. 1992, "Magnetic Sensor For Detecting Marking", vol. 16, No. 252.
Patent Abstracts of Japan, Feb. 1984, "Bias System of Head Using Magnetic-Resistance Effectelement", vol. 8, No. 38.

*Primary Examiner*—Aristotelis Psilos
*Assistant Examiner*—Patrick Wamsley
*Attorney, Agent, or Firm*—Hill, Steadman & Simpson

[57] ABSTRACT

A magnetoresistive element of a magnetoresistive head is connected to the emitter of a first-stage transistor which serves as a common base amplifier. A base current supplied to the base of the first-stage transistor is adjusted to equalize a sensing current to an emitter current. A reproducing circuit of such an arrangement requires no sensing current source and no DC blocking capacitor.

6 Claims, 4 Drawing Sheets

REPRODUCING CIRCUIT HAVING COMMON BASE AMPLIFIER, LOW-PASS FILTER AND PEAK DETECTOR FOR USE WITH MAGNETORESISTIVE HEAD

BACKGROUND OF THE INVENTION

1. Field of the Invention

The present invention relates to a reproducing circuit for use with a magnetoresistive (MR) head, and more particularly to a reproducing circuit for use with an MR head which requires no sensing current source for reducing electric power consumption.

2. Description of the Prior Art

MR heads as well as ordinary inductive heads are used as reproducing heads for use with hard disk drives (HDD). The MR heads have a thin magnetic film whose resistivity is varied by a magnetic field applied from a magnetic medium, and the variation in the resistivity is detected as a reproduced output voltage. The MR heads are also widely used as high-density recording and reproducing heads for use with digital audio tape recorders because the MR heads are of a high output capability, suffer a low crosstalk, and are not speed-dependent.

One known MR head, a shielded MR head, is shown in FIG. 1 of the accompanying drawings.

The shielded MR head shown in FIG. 1 comprises a pair of shield cores 11 defining a gap 12 therebetween which accommodates an MR element 13 integral with a signal conductor 14, and a bias conductor 15 parallel to the signal conductor 14. A signal magnetic field applied from a magnetic medium is directly picked up by the MR element 13.

The MR head shown in FIG. 1 is of the current bias type. Another known MR head is of the shunt bias type which does not require the bias conductor 15. In the MR head of the shunt bias type, a magnetic field is applied by an MR current itself which flows in the signal conductor 14.

The above MR head is illustrated as a reproducing head. If the MR head is used in a recording and reproducing head assembly, then the MR head and a thin-film inductive recording head may be superimposed or juxtaposed on the same substrate as a composite head arrangement, or the MR head may be integrally combined with an independent recording head.

An equivalent circuit of a reproducing circuit for use with the current-bias-type MR head is illustrated in FIG. 2 of the accompanying drawings. As shown in FIG. 2, an MR (sensing) current is supplied from a current source 2 to an MR element 13 of the current-bias-type MR head, denoted at 1, and a variation in the resistance of the MR element 13 which is caused by a signal magnetic field applied from a magnetic medium is picked up as a voltage. At the same time, in order to cause the MR element 13 to operate linearly, a bias current is supplied from a bias current source 16 to a bias conductor 15 to apply a bias magnetic field to the MR element 13.

The bias conductor 15 and the MR element 13 have grounded terminals. The voltage produced across the MR element 13 is applied through a DC blocking capacitor 3 as an unbalanced output voltage to a reproducing amplifier 4, which amplifies the applied signal.

The capacitance of the DC blocking capacitor 3 is selected to pass the supplied input signal to the extent that the error rate will not be lowered. For example, the capacitance of the DC blocking capacitor 3 is selected in the range of from about 0.01 $\mu$F to 0.1 $\mu$F depending on the bit rate.

A reproducing circuit for use with the shunt-bias type MR head is similar to the reproducing circuit shown in FIG. 2 except that the bias current source 16 and the bias conductor 15 are dispensed with.

FIG. 3 of the accompanying drawings shows a conventional recording and reproducing IC (W/R circuit) for use in a recording and reproducing apparatus which incorporates an integral assembly of an MR reproducing head and an inductive recording head. In FIG. 3, an MR head 1 is of the same circuit arrangement as the equivalent circuit shown in FIG. 2, and is combined with a recording head 17 and mounted on the tip end of a gimbal or the like.

The recording and reproducing apparatus, denoted at 18, comprises a reproduced signal processor 19 in the form of an IC and the MR head 1. The reproduced signal processor 19 has a constant voltage source 22 and a W/R circuit 33. The W/R circuit 33 has a reproducing amplifier 4 and a recording amplifier 21. The reproducing amplifier 4 has an output terminal connected to a reproduced output terminal T13, and the recording amplifier 21 has an input terminal connected to a recording input terminal T14. The reproduced output terminal T13 outputs a reproduced signal that has been picked up by the MR head 1, and the recording input terminal T14 is supplied with a recording signal to be recorded on a recording medium. The recording amplifier 21 has balanced output terminals connected to recording output terminals T11, T12 which are connected respectively to recording head terminals T5, T6 coupled to a recording coil of the recording head 17 combined with the MR head 1.

The terminals of the MR element 13 are connected to respective MR element terminals T2, T3, and the terminals of the bias conductor 15 are connected to respective bias conductor terminals T1, T4. The MR element terminal T3 is connected to a ground input terminal T9 of the reproduced signal processor 19, and the bias conductor terminal T4 is connected to a ground input terminal T10 of the reproduced signal processor 19.

The bias conductor terminal T1 is connected to a bias output terminal T7 that is connected to the constant voltage source 22 through a variable resistor 23 for adjusting a bias current.

The MR element terminal T2 is connected to a reproducing amplifier input terminal T8 which is connected to the input terminal of the reproducing amplifier 4 in the W/R circuit 33 through a DC blocking capacitor 3. A variable resistor 24 for adjusting an MR current is connected between the output terminal of the constant voltage source 22 and the reproducing amplifier input terminal T8.

In the conventional recording and reproducing apparatus 18 combined with the MR head 1, it is necessary to optimize a bias current supplied to the bias conductor 15 in order to obtain a reproduced signal with reduced distortions from the MR element 13. Therefore, a current from the constant voltage source 22 is supplied to the variable resistor 23 which adjusts the bias current.

The MR current supplied to the MR element 13 has to be set to an optimum value because it differs depending on the type and lot of the MR head 1. If the MR head 1 is of the shunt bias type, then it is necessary to adjust the MR current supplied to the MR element 13 in order to produce a reproduced waveform with reduced distortion. Therefore, the MR current is adjusted by the variable resistor 24.

As described above, the reproducing circuit shown in FIG. 2 requires the current source 2 for supplying the sensing current to the MR element 13 and also the bias current source 16 for supplying the bias current to the bias conductor 15. The recording and reproducing circuit shown in FIG. 3 requires the constant voltage source 22 and the variable resistor 24 for adjusting the MR current, resulting in increased current consumption in the reproduced signal processor 19.

If the MR head 1 shown in FIG. 2 is of a multi-head structure, then it is necessary to employ individual variable resistors 23, 24 for adjusting the MR and bias currents that are supplied to MR elements and bias conductors for respective channels. Accordingly, the number of variable resistors used is increased, and so is the number of locations where their adjustments have to be made. Another problem is that the power consumption is increased because the head of each channel is supplied with a current at all times.

In the case where the W/R circuit 33 is used with an HDD, since the capacitance of the DC blocking capacitor 3 is of such a value that it cannot be contained in the IC of the W/R circuit 33, the reproduced signal processor 19 is required to have a terminal for connection to an external DC blocking capacitor 3 and a terminal for being supplied with a signal to supply a sensing current. Consequently, if the W/R circuit 33 is of a multi-channel circuit arrangement, then the number of terminals added is increased, and also the number of external DC blocking capacitors is increased.

OBJECTS AND SUMMARY OF THE INVENTION

It is therefore an object of the present invention to provide a reproducing circuit for use with a magnetoresistive head, which requires no sensing current source and achieves a reduction in electric power consumption.

According to the present invention, there is provided a reproducing circuit for use with a magnetoresistive head, comprising a common base amplifier coupled to a magnetoresistive for amplifying an output signal from the magnetoresistive head, a low-pass filter connected to the common base amplifier for limiting a high-frequency component of an output signal from the common base amplifier, and a peak detector connected to the low-pass filters for holding a peak value of an output signal from the low-pass filter, converting the peak value into a digital signal, and outputting the digital signal as a reproduced signal.

The common base amplifier may preferably comprise a common base transistor. The reproducing circuit may preferably further comprise a voltage source, the common base transistor having a base and a collector which are connected to the voltage source, and an emitter connected to the magnetoresistive head. Preferably, the reproducing circuit may further concise a current source connected to the base of the common base transistor for biasing the base of the common base transistor.

Preferably, the reproducing circuit may further comprise a reference voltage source, a voltage-input/current-output amplifier for amplifying the difference between the output signal from the common base amplifier and a signal from the reference voltage source, and DC feedback means for feeding an output current from the voltage-input/current-output amplifier to the common base amplifier. The low-pass filter may preferably be connected to the DC feedback means.

Since the common base amplifier is employed as a reproducing amplifier, it is possible to adjust a sensing current supplied to the MR head by adjusting a base current supplied to the base of the reproducing amplifier, with no sensing current source and no DC blocking capacitor required.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 4:
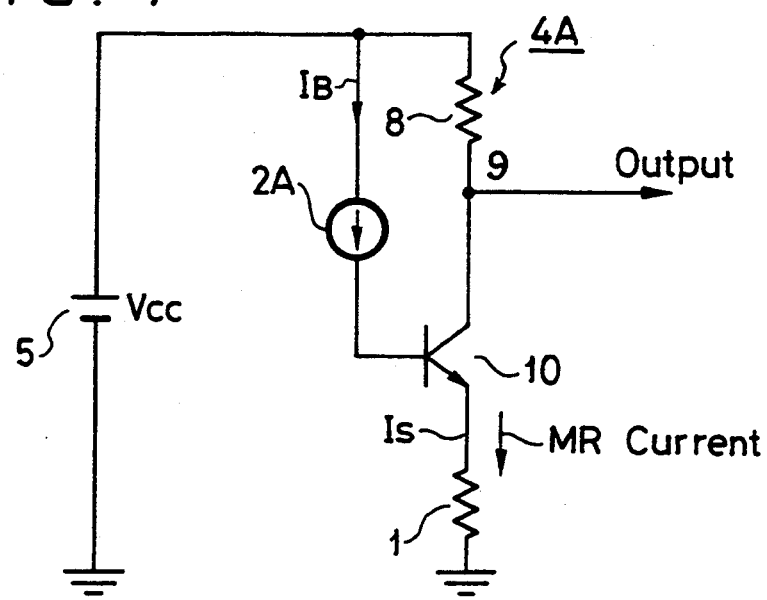
FIG. 4 is a circuit diagram illustrative of the principles of a reproducing circuit for use with an MR head, which incorporates a common base amplifier, according to the present invention.

FIG. 4 schematically shows the principles of a reproducing circuit for use with an MR head according to the present invention. As shown in FIG. 4, the reproducing circuit has a reproducing amplifier in the form of a common base amplifier 4A. The common base amplifier 4A has a first-stage NPN transistor 10 having an emitter connected an MR element of an MR head 1. The transistor 10 also has a base connected through a base current source 2A to the anode of a VCc voltage source 5 whose cathode is grounded, and a collector connected through a load resistor 8 to the anode of the Vcc voltage source 5. The reproducing circuit outputs a reproduced output signal 9 through the collector of the transistor 10.

Figure 5:
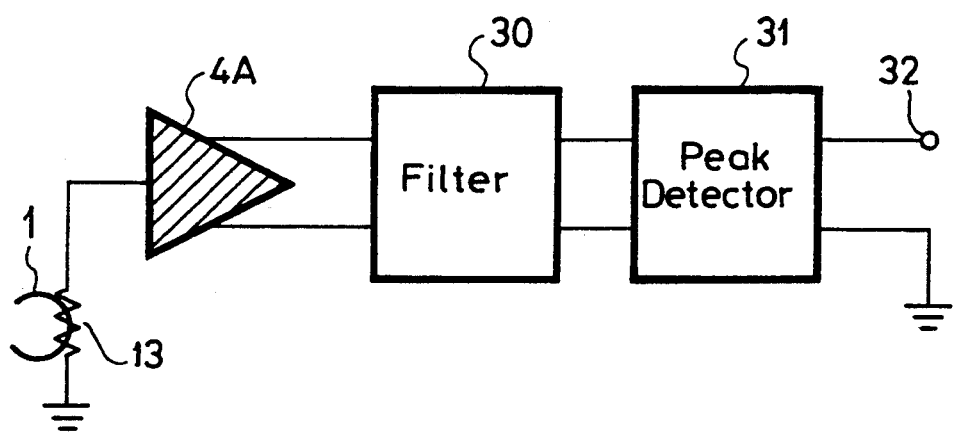
FIG. 5 is a block diagram of an analog system of an HDD which employs the reproducing circuit for use with an MR head according to the present invention.

FIG. 5 shows an analog system of an HDD which employs the common base amplifier 4A composed of the common base common base first-stage transistor 10.

In FIG. 5, an MR element 13 of an MR head 1 has a terminal grounded and the other terminal connected directly to the emitter of the first-stage transistor 10 of the common base amplifier 4A, not through the DC blocking capacitor 3 which would otherwise be employed in the conventional reproducing circuit. The input terminal of the common base amplifier 4A is unbalanced, but its output terminals are balanced. The output terminals of the common base amplifier 4A are connected to a low-pass filter (LPF) 30 which limits a high-frequency component of an output signal from the common base amplifier 4A. The LPF 30 is connected to a peak detector 31 which detects the peak value of a signal whose high-frequency component has been limited by the LPF 30. The detected peak value is converted by a data separator in the peak detector 31 into a digital value, which is supplied as a reproduced signal to a digital output terminal 32.

Figure 1:
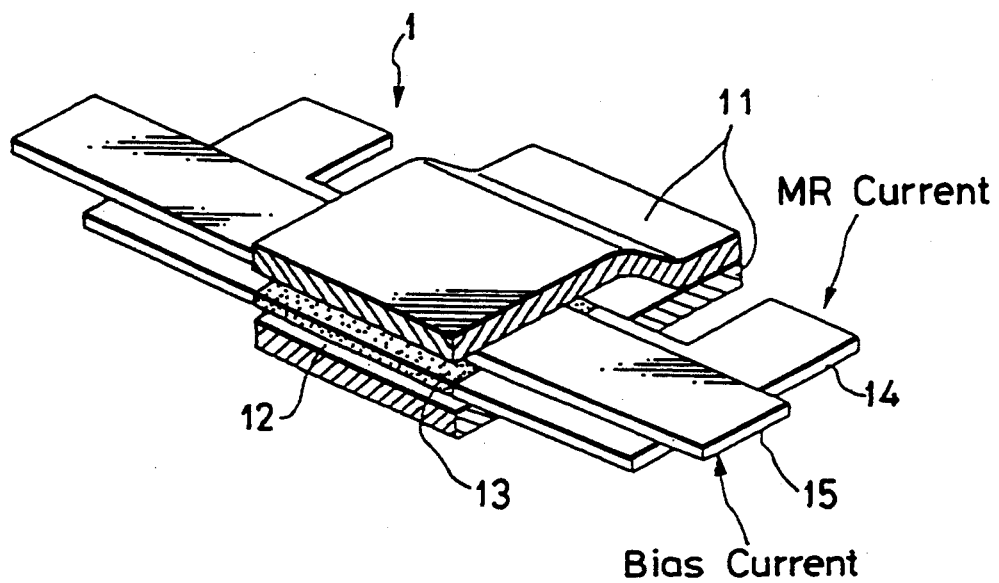
FIG. 1 is a fragmentary perspective view of a conventional shielded MR head.
Figure 2:
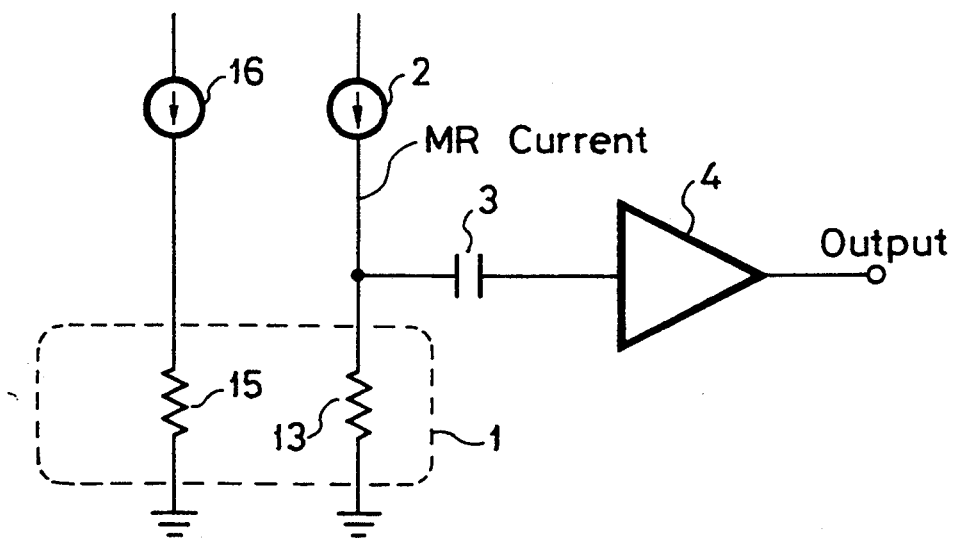
FIG. 2 is a circuit diagram of a conventional reproducing circuit for use with an MR head.
Figure 3:
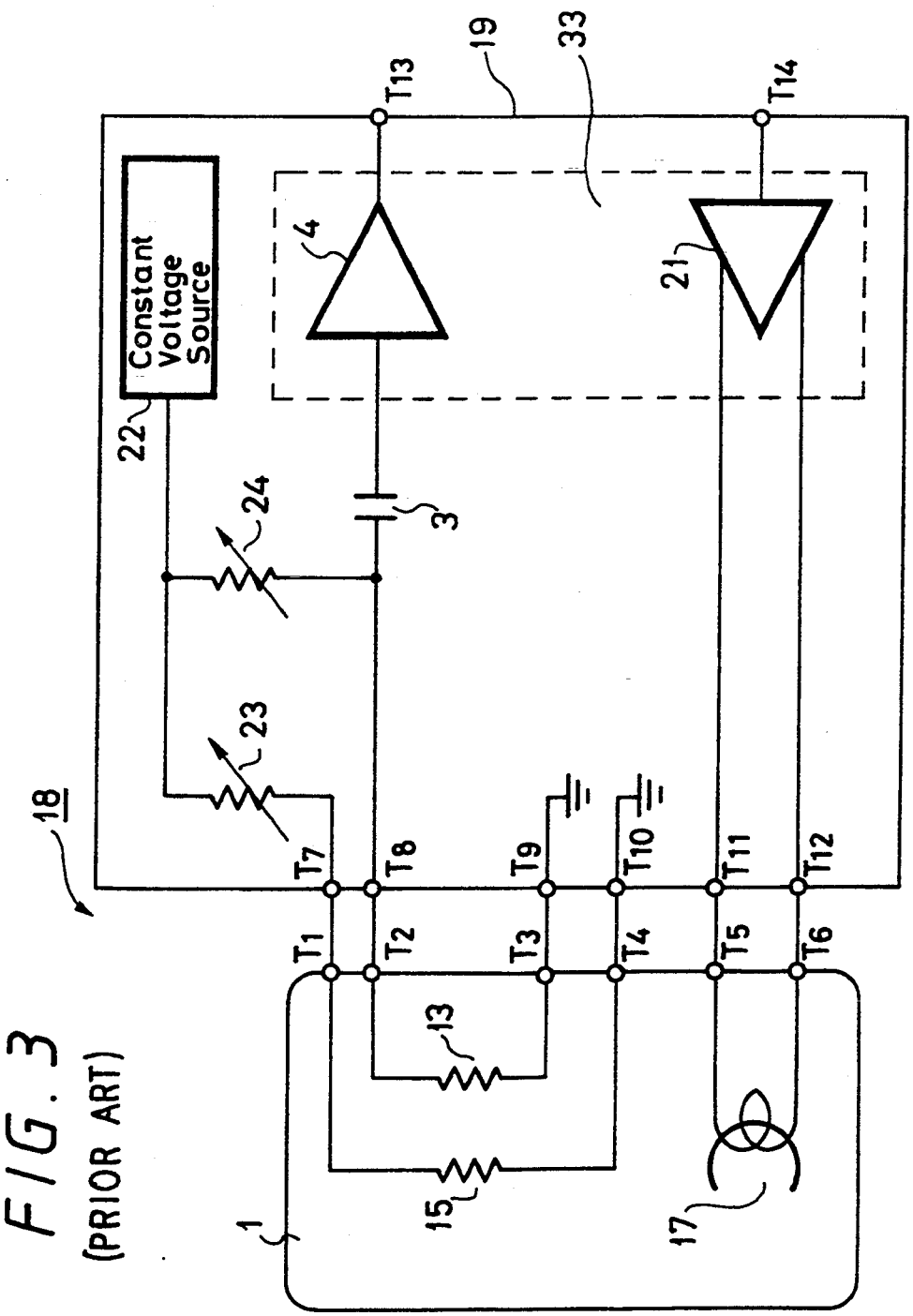
FIG. 3 is a circuit diagram of a conventional recording and reproducing circuit for use with an MR head.

The base of the common-base first-stage transistor 10 is biased by the base current source 2A (see FIG. 4). Therefore, the first-stage transistor 10 operates as the current source 2A similar to the current source 2 shown in FIG. 2 by adjusting the bias so that an MR (sensing) current IS flowing through the MR element 13 connected between the emitter and ground is equal to the emitter current.

A variation in the resistance of the MR head 1 which is caused by a magnetic field applied from a magnetic medium (not shown) is detected as a voltage change by the emitter current (=sensing current IS) flowing through the MR element 13, and applied to the emitter of the first-stage transistor 10. Since the first-stage transistor 10 operates as a common base amplifier, the applied signal is amplified and outputted as the reproduced output signal 9.

Inasmuch as the fixed Vcc voltage source 5 adjusts the sensing current IS so as to be equal to the emitter current even without providing a separate current source for supplying the MS (sensing) current IS, no current source for supplying a sensing current is required, and hence it is possible to reduce the power consumption by the reproducing circuit by an amount corresponding to the power consumption by such a current source. Furthermore, since no DC blocking capacitor is required between the MR element 13 and the first stage transistor 10, any terminal for supplying a sensing current and any terminal for supplying an input signal, which would otherwise be required by such a DC blocking capacitor not contained in a W/R IC, are unnecessary. The number of terminals and external components (DC blocking capacitors) required in a multi-channel circuit arrangement is thus greatly reduced, and any process of attaching such terminals and external components is eliminated.

In the above embodiment, the base current source 2A is used as a base bias source for adjusting the sensing current IS. However, a sensing current may be adjusted by a DC feedback circuit as shown in FIG. 6.

Figure 6:
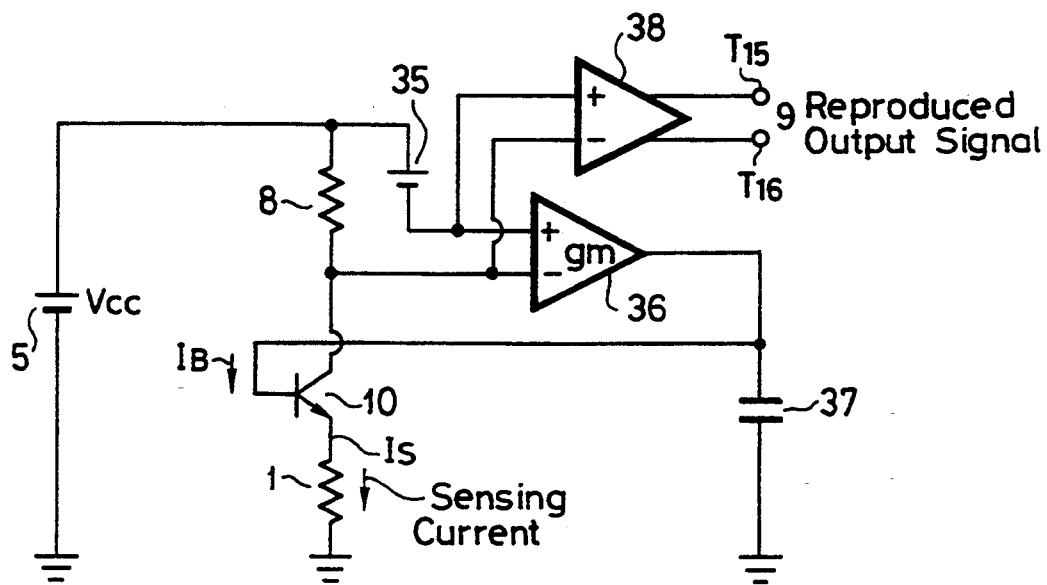
FIG. 6 is a circuit diagram of a reproducing circuit for use with an MR head, which incorporates a common base amplifier, according to an embodiment of the present invention.

FIG. 6 shows a reproducing circuit for use with an MR head, which incorporates a common base amplifier, according to an embodiment of the present invention. Those parts shown in FIG. 6 which are identical to those shown in FIG. 4 are denoted by identical reference numerals, and will not be described in detail below.

In FIG. 6, a reproduced output signal 9 from the junction between a load resistor 8 and a first-stage transistor 10 is supplied to a noninverting input terminal of a voltage-input/current-output amplifier (hereinafter referred to as a "gm amplifier") 36. The anode of a Vcc voltage source 5 is connected to the anode of a reference voltage source 35 whose cathode is connected to an inverting input terminal of the gm amplifier 36. The gm amplifier 36 has its output terminal connected to ground through an LPF capacitor 37 whose capacitance may be of 0.1 µF, for example. A DC signal from the junction between the LPF capacitor 37 and the gm amplifier 36 is fed back to the base of the first-stage transistor 10. A driving amplifier 38 has input terminals connected to the inverting and noninverting input terminals of the gm amplifier 36, and outputs a balanced reproduced output signal to output terminals T15, T16.

The voltage developed across the load resistor 8 through which the collector current of the first-stage transistor 10 flows is detected, and the difference between the detected voltage and a reference voltage VREF from the reference voltage source 35 is amplified by the gm amplifier 36. The gm amplifier 36, which is a voltage-input/current-output amplifier, produces an output current whose DC component is fed as a base current IB to the base of the first-stage transistor 10. The base current IB is selected to be equal to a sensing current IS that flows through the ME element 13 of the MR head 1.

The LPF capacitor 37 has a capacitance selected to provide a sufficiently low cutoff frequency of 100 kHz or lower. An AC component of the output current from the gm amplifier passes through the LPF capacitor 37, whereas a DC component thereof is fed back to the base of the first-stage transistor 10. The sensing current IS is determined by the reference voltage VREF and the resistance R of the load resistor 8, as indicated by $IS = -VREF/R$.

Figure 7:
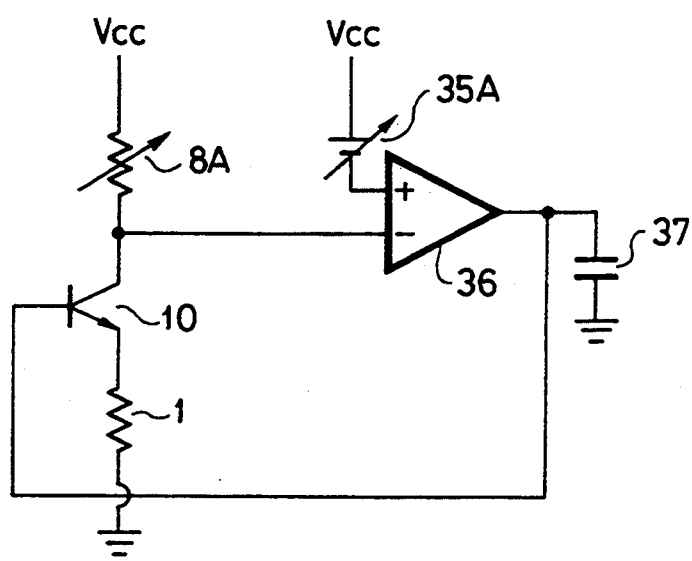
FIG. 7 is a circuit diagram of a reproducing circuit for use with an MR head, which incorporates a common base amplifier, according to another embodiment of the present invention.

Therefore, as shown in FIG. 7, it is possible to employ a variable resistor 8A a variable reference voltage source 35A for varying an input signal supplied to the gm amplifier 36 for thereby controlling an output current (=base current IB) from the gm amplifier 36.

It is also possible to employ a fixed reference voltage source instead of the variable reference source 35A, a fixed load resistor instead of the variable resistor 8A, and a variable-gain amplifier instead of the gm amplifier 36.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A reproducing circuit for use with a magnetoresistive head, comprising:
   a common base amplifier coupled to a magnetoresistive head for amplifying an output signal from the magnetoresistive head;
   a low-pass filter connected to said common base amplifier for limiting a high-frequency component of an output signal from said common base amplifier;
   a current source connected to said base of the common base amplifier for adjusting a bias of the sensing current flowing through said magnetoresistive head to be equal to an emitter current of said common base amplifier; and
   a peak detector connected to said low-pass filter for holding a peak value of an output signal from said low-pass filter, convening the peak value into a digital signal, and outputting the digital signal as a reproduced signal.

2. A reproducing circuit according to claim 1, wherein said common base amplifier comprises a common base transistor.

3. A reproducing circuit according to claim 2, further comprising a voltage source, said common base transistor having a base and a collector which are connected to said voltage source, and an emitter connected to said magnetoresistive head.

4. A reproducing circuit according to claim 3, further comprising a current source connected to said base of the common base transistor for biasing the base of the common base transistor.

5. A reproducing circuit according to claim 1, further comprising:

a reference voltage source;

a voltage-input/current-output amplifier for amplifying the difference between the output signal from said common base amplifier and a signal from said reference voltage source; and DC feedback means for feeding an output current from said voltage-input/current-output amplifier to said common base amplifier.

6. A reproducing circuit according to claim 5, wherein said low-pass filter is connected to said DC feedback means.

* * * * *